United States Patent
Fang

[19]

[11] Patent Number: 6,165,914
[45] Date of Patent: Dec. 26, 2000

[54] METHOD FOR FABRICATING SEMICONDUCTOR DEVICES WITH THICK HIGH QUALITY OXIDES

[75] Inventor: Wingra T. Fang, Saratoga, Calif.

[73] Assignee: Agilent Technologies, Palo Alto, Calif.

[21] Appl. No.: 08/968,149

[22] Filed: Nov. 12, 1997

[51] Int. Cl.[7] .................................................. H01L 21/31
[52] U.S. Cl. ........................................... 438/787; 438/770
[58] Field of Search ..................................... 438/242, 246, 438/248, 270, 192, 268, 269, 416, 621, 787, 770

[56] References Cited

U.S. PATENT DOCUMENTS

| | | | |
|---|---|---|---|
| 5,103,276 | 4/1992 | Shen et al. | 357/23.6 |
| 5,106,776 | 4/1992 | Shen et al. | 438/248 |
| 5,300,450 | 4/1994 | Shen et al. | 438/243 |
| 5,851,899 | 12/1998 | Weigand | 438/427 |

*Primary Examiner*—David Nelms
*Assistant Examiner*—Reneé R. Berry
*Attorney, Agent, or Firm*—James C. Pintner

[57] ABSTRACT

The rapid growth of thick thermally grown oxide layers on silicon wafers is described herein. By patterning and etching a plurality of pillars on the surface of the silicon wafer, oxide growth is primarily lateral and not vertical, enabling it to proceed much faster. In other embodiments, the pillars are fabricated with an oxygen barrier on their top surface, preventing oxide growth on the top of the pillars and resulting in an oxide layer with a more planar upper surface.

7 Claims, 2 Drawing Sheets

METHOD FOR FABRICATING SEMICONDUCTOR DEVICES WITH THICK HIGH QUALITY OXIDES

BACKGROUND OF THE INVENTION

The growth of high quality oxides of silicon on silicon wafers is a fundamental and critical aspect of semiconductor chip fabrication. Several different methods are currently used to create oxide layers on silicon wafers.

The highest quality oxides are those grown thermally, as opposed to those which are deposited. The growth time of a thick oxide typically follows a square law, where the final thickness of the oxide is a function of the square of the total oxidation time. Thus, the time required to grow a thick oxide layer can rapidly become commercially unrealistic, forcing manufacturers to use deposited oxide layers, which are typically of lower quality.

High temperature oxidation increases the growth rate of the oxide but can cause other problems. Dopant diffusion occurs much more rapidly at elevated temperatures, which can negatively affect the electrical performance of the chips being fabricated at the same time that a thicker oxide layer is being created. As the square law is still in effect, even at elevated temperatures, the thickness of the oxide grown is still a function of the square of the oxidation time.

High pressure oxidation also allows faster growth of the oxide layer. However, this type of processing requires a special furnace, capable of withstanding the high pressures used for the oxide layer growth. As the square law remains in effect, the thickness of the oxide layer is still a function of the square of the oxidation time.

A faster growing but lower quality oxide can be created by depositing low density, amorphous silicon and oxidizing it. However, such layers require special processing machines to deposit the low density silicon. The growth of these oxide layers still obeys the previously mentioned square law and does not result in a layer whose planarity is acceptable without additional processing.

The aforementioned methods to grow or deposit oxide layers create decidedly non-planar oxide layers. These non-planar oxide layers must be further processed to obtain the degree of planarity needed to fabricate working integrated circuits ("IC"s). These additional processing steps are complicated and add to the expense of fabricating the ICs.

A method for producing thermally grown, reasonably planar thick oxide layers economically would be a valuable advance in semiconductor chip fabrication.

SUMMARY OF THE INVENTION

The present invention describes a method for growing thick, high quality oxides quickly. The method dramatically increases the thickness of the oxide layer that can be grown in a commercially reasonable amount of time. The resulting oxide layer is also relatively co-planar with the IC's active devices. The method increases the surface area of silicon to be oxidized, by which means the apparent oxidation rate is increased. In a first embodiment of the present invention, an array of pillars are etched into the silicon and oxidized. The oxidation occurs on both the sidewalls and tops of the pillars. When the pillars are completely oxidized, the spaces between them are filled with oxide. In a second embodiment of the present invention, silicon nitride or any other barrier to oxidation is layered on top of the pillars. As only the sides of the pillars oxidize in this embodiment, the resulting oxide layer is much more nearly planar.

The first and second embodiment of the present invention will now be described in detail with reference to the figures listed and described below.

DETAILED DESCRIPTION OF THE PREFERRED EMBODIMENTS

Figure 1:
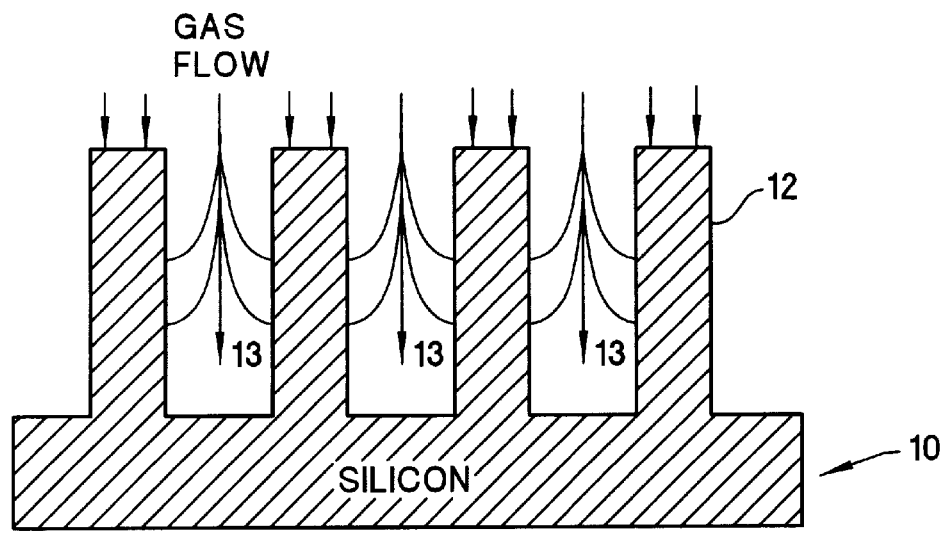
FIG. 1 shows the preformed surface of a semiconductor wafer before being oxidized using a first embodiment of the present invention.

As shown in FIG. 1, the upper surface of silicon wafer 10 is etched to form a plurality of pillars 12. The pillars are at least 1 $\mu$m in height. Although described herein as pillars, the exact shape is not crucial to the practice of this invention. An array of long, thin rectangular shapes or any other such form could be etched into the silicon and the present invention would function equally well. Therefore, pillars herein should not be read in its limited sense, but should rather be understood to include any of these or other alternate shapes. The exact cross section is not a critical aspect of the present invention, although the chosen shape should have as few corners as possible, as oxide growth at corners is very slow. As long as the selected shape has rounded edges, the process described herein will proceed in an acceptable fashion. Also, the height and the spacing of the pillars can be varied to control both the speed of oxidation as well as the final thickness of the oxide layer. As a pillar of width/diameter $\tau$ produces an oxide area of width/diameter 1.82 $\tau$, spacing and pillar size can be varied accordingly to achieve the desired oxide thickness.

Figure 2:
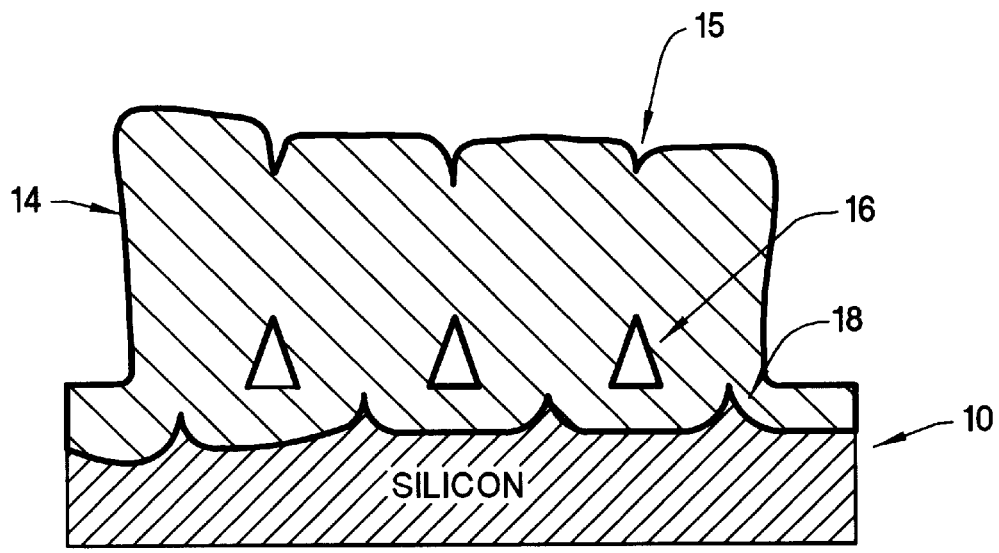
FIG. 2 shows the semiconductor wafer after it has been oxidized according to the first embodiment of the present invention.

During the oxidation process, oxidation occurs on both the sidewalls and top surface of the pillars, with a resulting final structure as shown in FIG. 2. Oxide layer 14 has an irregular top surface 15, a plurality of voids 16 near where the bases of pillars 12 had been, and remnants 18 of pillars 12. As the ratio of oxide created to silicon consumed is approximately 2:1, when pillars 12 are completely oxidized, the spaces 13 between the pillars are filled with oxide.

It is impossible to ensure that the top of pillars 12 will oxidize at the same rate as the bottom of the pillars. Typically, the top of pillars 12 will oxidize more rapidly than the bottom, leaving voids 16 at the bottom of the pillars. Voids 16 and pillar remnants 18 are buried below the surface of the oxide layer. Although this method of oxide layer fabrication generates defects which will affect the active IC components, these effects can be minimized by blocking the active devices from the growing oxide layer by deep trenches.

Although the final oxide layer is not planar, any of the known advanced planarization techniques can be used to accomplish that end.

Once spaces 13 are filled with oxide, the oxidation rate slows dramatically, as the oxygen must diffuse through a thick layer of oxide before the silicon surface is reached and oxidation can continue further. Thus, the oxidation process described herein is self-limiting to the height of pillars 12 and the final oxide thickness can be controlled accurately.

Figure 3:
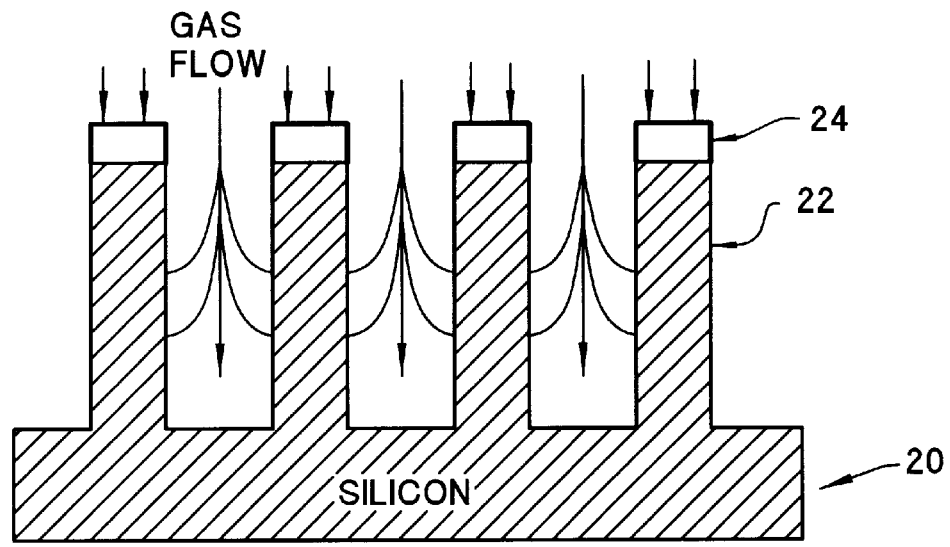
FIG. 3 shows the preformed surface of a semiconductor wafer before being oxidized using a second embodiment of the present invention.
Figure 4:
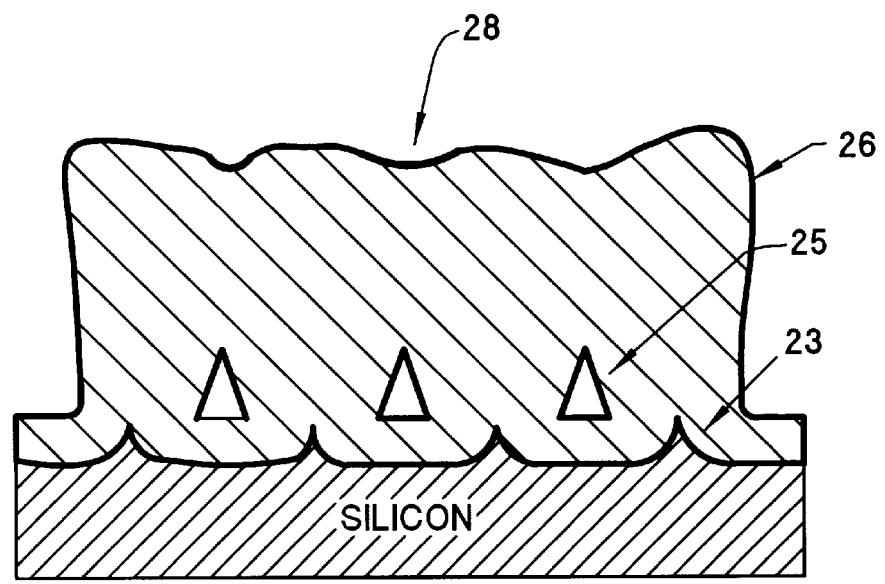
FIG. 4 shows the semiconductor wafer after it has been oxidized according to the second embodiment of the present invention.

A second embodiment of the present invention is illustrated in FIGS. 3 and 4. Pillars 22 are fabricated on silicon wafer substrate 20. Before pillars 22 are patterned and etched, a thin silicon nitride layer or other oxygen barrier layer 23 is grown or deposited on top of a thin stress relief oxide layer on top of the silicon wafer. When pillars 22 are patterned and etched, they have a small silicon nitride barrier 24 on their top surface. It is well known that oxygen does not diffuse well through silicon nitride. This knowledge has been the basis for local oxidation methods that form an important part of CMOS wafer processing. When pillars 22 with barriers 24 are exposed to oxidation, only the sides of the pillar structures are oxidized. The tops of the pillars, covered with silicon nitride, are not oxidized, resulting in a more planar final structure.

The present invention, in both its embodiments described herein, allows the rapid thermal growth of high quality oxides. Growth of the oxides is primarily lateral, not vertical, which allows for a large reduction in the time necessary to grow thick oxides. The quality of the oxide layer is similar to that of oxide layers grown thermally using known processes. In oxides grown using the methods described herein, there may be some dislocations at the bottom of the oxide layer due to the three dimensional growth of the oxide there. The effects of these dislocations can be minimized by fabricating deep trenches around the active IC components.

What is claimed is:

1. A method for thermally growing thick oxide layers on a silicon substrate, the method comprising the steps of:
   forming a plurality of silicon pillars on the silicon substrate, the pillars having spaces therebetween; and
   exposing the patterned and etched silicon substrate to a thermal oxidizing environment until the pillars are completely oxidized and the spaces are filled with oxide from the oxidization of the pillars;
   whereby the oxidized pillar material forms a thick oxide layer.

2. The method of claim 1 wherein the silicon pillars are at least 1 $\mu$m in height.

3. The method of claim 1 further comprising the steps of:
   depositing an oxygen barrier layer on top of the silicon substrate before masking and etching the silicon substrate.

4. The method of claim 3 wherein the silicon pillars are at least 1 $\mu$m in height.

5. A method as recited in claim 1, wherein the step of forming includes masking and etching the silicon substrate.

6. A method as recited in claim 1, wherein the step of forming includes forming pillars and spaces having dimensions which are in a ratio substantially equal to a ratio of oxide created to silicon consumed.

7. A method as recited in claim 6, wherein the step of forming includes forming pillars and spaces having a ratio of silicon to total dimension in the range of ratios of 1.82:1 to 2:1.

* * * * *